(12) United States Patent
Philipp et al.

(10) Patent No.: US 7,696,510 B2
(45) Date of Patent: Apr. 13, 2010

(54) INTEGRATED CIRCUIT INCLUDING MEMORY HAVING REDUCED CROSS TALK

(75) Inventors: Jan Boris Philipp, Munich (DE); Thomas Happ, Dresden (DE)

(73) Assignee: Qimonda AG, Munich (DE)

( * ) Notice: Subject to any disclaimer, the term of this patent is extended or adjusted under 35 U.S.C. 154(b) by 200 days.

(21) Appl. No.: 11/948,204

(22) Filed: Nov. 30, 2007

(65) Prior Publication Data

US 2009/0046498 A1    Feb. 19, 2009

(51) Int. Cl.
*H01L 47/00* (2006.01)
(52) U.S. Cl. .................. 257/4; 257/5; 257/E29.276; 438/197; 438/900
(58) Field of Classification Search .......... 257/1–8, 257/289, E29.276; 365/100, 148; 338/13; 438/900, 197
See application file for complete search history.

(56) References Cited

U.S. PATENT DOCUMENTS

2006/0113520 A1* 6/2006 Yamamoto et al. ............ 257/3
2008/0237566 A1* 10/2008 An et al. ...................... 257/4

* cited by examiner

*Primary Examiner*—Evan Pert
*Assistant Examiner*—Scott R Wilson
(74) *Attorney, Agent, or Firm*—Dicke, Billig & Czaja, PLLC

(57) ABSTRACT

An integrated circuit includes a first electrode, a second, a first resistivity changing material contacting the first electrode at a first interface, and a second resistivity changing material contacting the second electrode at a second interface. A direct communication path between the first interface and the second interface is greater than the lateral distance.

22 Claims, 4 Drawing Sheets

INTEGRATED CIRCUIT INCLUDING MEMORY HAVING REDUCED CROSS TALK

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

One undesirable feature of resistive memory arrays is electrical and thermal crosstalk between cells. Cross talk between cells might occur with shared storage material geometries such as plate architecture or shared storage material along a bit line. These architectures relax the need for small scale patterning of phase change material and reduce risks due to etch or chemical mechanical planarization (CMP) damage.

For these and other reasons, there is a need for the present invention.

SUMMARY

One embodiment provides an integrated circuit. The integrated circuit includes a first electrode, a second electrode, a first resistivity changing material contacting the first electrode at a first interface, and a second resistivity changing material contacting the second electrode at a second interface. A direct communication path between the first interface and the second interface is greater than the lateral distance.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various embodiments described herein may be combined with each other, unless specifically noted otherwise.

Figure 1:
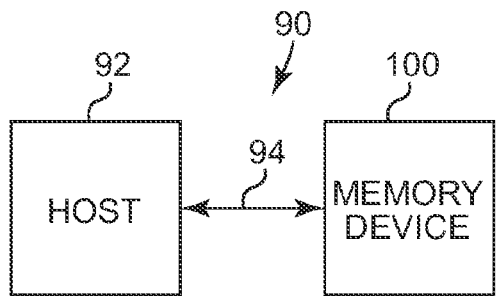
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a resistivity changing memory device or a phase change memory device.

Figure 2:
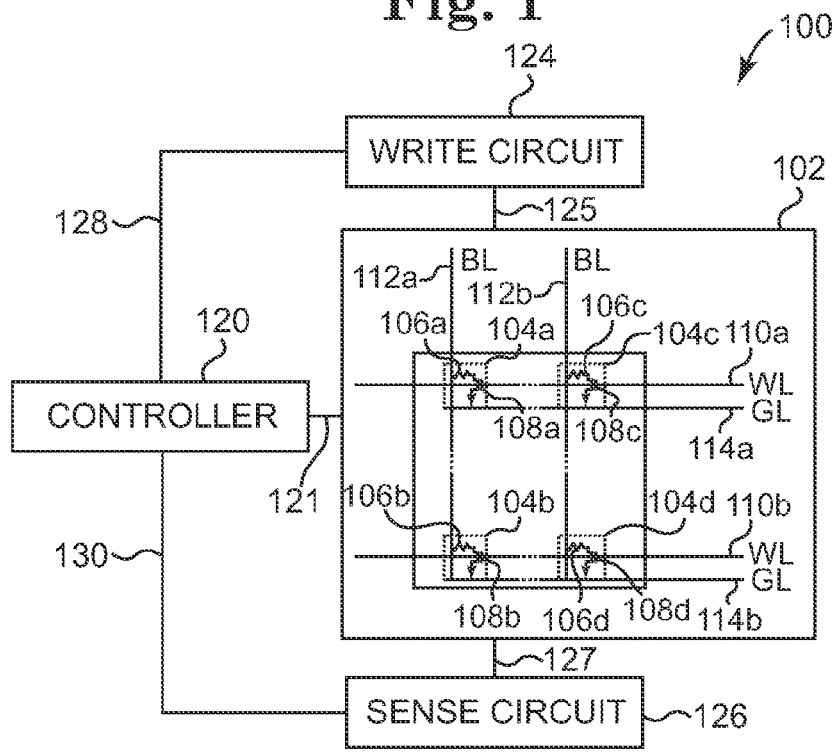
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes a write circuit 124, a controller 120, a memory array 102, and a sense circuit 126. Memory array 102 includes a plurality of resistivity changing memory cells 104a-104d (collectively referred to as resistive memory cells 104), a plurality of bit lines (BLs) 112a-112b (collectively referred to as bit lines 112), a plurality of word lines (WLs) 110a-110b (collectively referred to as word lines 110), and a plurality of ground lines (GLs) 114a-114b (collectively referred to as ground lines 114). In one embodiment, resistivity changing memory cells 104 are phase change memory cells. In other embodiments, resistivity changing memory cells 104 are another suitable type of resistivity changing memory cells, such as magnetic memory cells.

Each phase change memory cell 104 includes a phase change memory element 106 and a select device 108. Each phase change memory element 106 includes phase change material and electrodes. Two adjacent phase change memory elements 106 (e.g., 106a and 106b) are spaced apart by a lateral distance. To prevent crosstalk between adjacent and nearby phase change memory elements 106, a direct communication path between an interface at a first electrode and an interface at a second adjacent electrode is greater than the lateral distance. For phase change memory elements 106, the crosstalk by a direct communication path is at least one of thermal communication and electrical communication. For another suitable type of resistivity changing memory elements 106, the direct communication path is one of direct thermal communication, direct electrical communication or any other, suitable direct communication.

As used herein, the term "electrically coupled" is not meant to mean that the elements must be directly coupled together and intervening elements may be provided between the "electrically coupled" elements.

As used herein, the term "direct communication path" is not meant to mean the nearest spatial connection between two locations and "direct communication path" is that path with the highest transfer rate. For thermal communication, the direct communication path is the path with highest heat transfer. For electrical communication, the direct communication path is the path with highest current transfer.

Memory array 102 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110 and a bit line 112. Phase change memory cell 104a is electrically coupled to bit line 112a and word line 110a, and phase change memory cell 104b is electrically coupled to bit line 112a and word line 110b. Phase change memory cell 104c is electrically coupled to bit line 112b and word line 110a, and phase change memory cell 104d is electrically coupled to bit line 112b and word line 110b.

Each phase change memory cell 104 is electrically coupled to a word line 110, a bit line 112, and a ground line 114. For example, phase change memory cell 104a is electrically coupled to bit line 112a, word line 110a, and ground line 114a, and phase change memory cell 104b is electrically coupled to bit line 112a, word line 110b, and ground line 114b. Phase change memory cell 104c is electrically coupled to bit line 112b, word line 110a, and ground line 114a, and phase change memory cell 104d is electrically coupled to bit line 112b, word line 110b, and ground line 114b.

Each phase change memory cell 104 includes a phase change memory element 106 and a select device 108. While select device 108 is a field-effect transistor (FET) in the illustrated embodiment, the select device 108 can be other suitable devices such as a bipolar transistor or a 3D transistor structure. In other embodiments, a diode-like structure may be used in place of transistor 108. In this case, a diode and phase change element 106 is coupled in series between each cross point of word lines 110 and bit lines 112.

Phase change memory cell 104a includes phase change memory element 106a and transistor 108a. One side of phase change memory element 106a is electrically coupled to bit line 112a and the other side of phase change memory element 106a is electrically coupled to one side of the source-drain path of transistor 108a. The other side of the source-drain path of transistor 108a is electrically coupled to ground line 114a. The gate of transistor 108a is electrically coupled to word line 110a.

Phase change memory cell 104b includes phase change memory element 106b and transistor 108b. One side of phase change memory element 106b is electrically coupled to bit line 112a and the other side of phase change memory element 106b is electrically coupled to one side of the source-drain path of transistor 108b. The other side of the source-drain path of transistor 108b is electrically coupled to ground line 114b. The gate of transistor 108b is electrically coupled to word line 110b.

Phase change memory cell 104c includes phase change memory element 106c and transistor 108c. One side of phase change memory element 106c is electrically coupled to bit line 112b and the other side of phase change memory element 106c is electrically coupled to one side of the source-drain path of transistor 108c. The other side of the source-drain path of transistor 108c is electrically coupled to ground line 114a. The gate of transistor 108c is electrically coupled to word line 110a.

Phase change memory cell 104d includes phase change memory element 106d and transistor 108d. One side of phase change memory element 106d is electrically coupled to bit line 112b and the other side of phase change memory element 106d is electrically coupled to one side of the source-drain path of transistor 108d. The other side of the source-drain path of transistor 108d is electrically coupled to ground line 114b. The gate of transistor 108d is electrically coupled to word line 110b.

In one embodiment, each resistivity changing memory element 106 is a phase change memory element that comprises a phase change material that may be made up of a variety of materials in accordance with the present invention. Generally, chalcogenide alloys that contain one or more elements from Group VI of the periodic table are useful as such materials. In one embodiment, the phase change material is made up of a chalcogenide compound material, such as GeSbTe, SbTe, GeTe, or AgInSbTe. In one embodiment, the phase change material is chalcogen free, such as GeSb, GaSb, InSb, or GeGaInSb. In other embodiments, the phase change material is be made up of any suitable material including one or more of the elements Ge, Sb, Te, Ga, As, In, Se, and S.

Each phase change memory element may be changed from an amorphous state to a crystalline state or from a crystalline state to an amorphous state under the influence of temperature change. The amount of crystalline material coexisting with amorphous material in the phase change material of one of the phase change memory elements thereby defines two or more states for storing data within memory device 100. In the amorphous state, a phase change material exhibits significantly higher resistivity than in the crystalline state. Therefore, the two or more states of the phase change memory elements differ in their electrical resistivity. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that are assigned multi-bit values, such as "00", "01", "10", and "11". In other embodiments, the two or more states are another suitable number of states in the phase change material of a phase change memory element.

Controller 120 includes a microprocessor, microcontroller, or other suitable logic circuitry for controlling the operation of memory device 100. Controller 120 controls read and write operations of memory device 100 including the application of control and data signals to memory array 102 through write circuit 124 and sense circuit 126. In one embodiment, write circuit 124 provides voltage pulses through signal path 125 and bit lines 112 to memory cells 104 to program the memory cells. In another embodiment, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

During a "set" operation of phase change memory cell 104a, a set current or voltage pulse is selectively enabled by write circuit 124 and sent through bit line 112a to phase change memory element 106a thereby heating phase change memory element 106a above its crystallization temperature (but usually below its melting temperature). In this way, phase change memory element 106a reaches its crystalline state or a partially crystalline and partially amorphous state during this set operation.

During a "reset" operation of phase change memory cell 104a, a reset current or voltage pulse is selectively enabled by write circuit 124 and sent through bit line 112a to phase change memory element 106a. The reset current or voltage quickly heats phase change memory element 106a above its melting temperature. After the current or voltage pulse is turned off, phase change memory element 106a quickly quench cools into the amorphous state or a partially amorphous and partially crystalline state.

Phase change memory cells 104b-104d and other phase change memory cells 104 in memory array 102 are set and reset similarly to phase change memory cell 104a using a similar current or voltage pulse. In other embodiments, for other types of resistive memory cells, write circuit 124 provides suitable programming pulses to program the resistivity changing memory cells 104 to the desired state.

Figure 3:
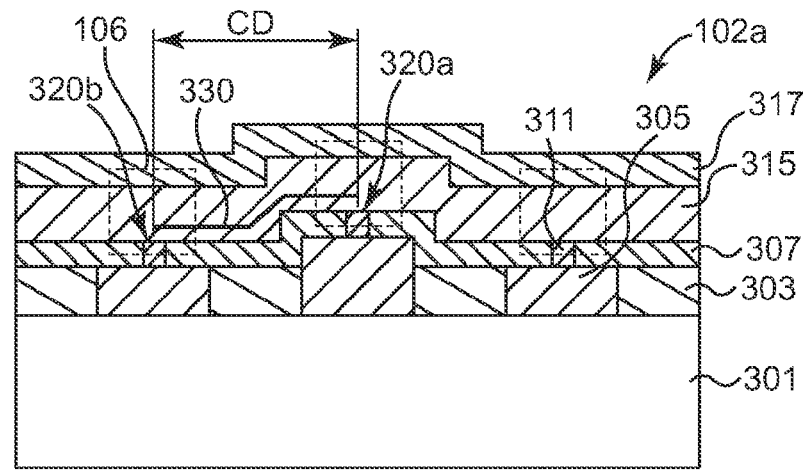
FIG. 3 illustrates a cross-sectional view of one embodiment of an array of resistivity changing memory elements.

FIG. 3 illustrates a cross-sectional view of one embodiment of an array 102a of phase change memory elements 106. Each phase change memory element 106 includes an electrode 311, phase change material 315, and a top electrode 317. In one embodiment, storage locations within phase change material 315 are located nearby the interfaces 320a-320b between phase change material 315 and electrodes 311. In another embodiment, the storage locations within the phase change material 315 are located directly at electrodes 311. Array 102a further includes a substrate 301 and isolation materials 303 and 307.

Substrate 301 includes Si substrate, Si on insulator (SOI) substrate, or other suitable substrate. In one embodiment, substrate 301 is pre-processed and includes select devices or other devices. In one embodiment, substrate 301 includes select devices 108, such as transistors of any type (e.g., FET or bipolar transistors) or diodes. In another embodiment, substrate 301 includes other suitable devices for semiconductor manufacturing like buried lines, etc.

Electrode 311 has any suitable shape, such as V-shape, non-regular shape, or cup-shape. In one embodiment, electrode 311 includes more than one material.

Interfaces 320a-320b between phase change material 315 and electrodes 311 of two adjacent phase change memory elements 106 are spaced apart by a lateral distance CD. In other embodiments, the lateral distance between interfaces 320a-320b of adjacent phase change memory elements 106 varies within an array 102 of phase change memory elements 106.

In one embodiment, phase change material 315 extends from one electrode 311 to adjacent electrode 311, where phase change material 315 forms a plate. In other embodiments, phase change memory elements 106 are physically separated.

In the embodiment illustrated in FIG. 3, the direct thermal communication path 330 between first interface 320a of a first phase change memory element 106 and second interface 320b of a second phase change memory element 106 is greater than the lateral distance CD between first interface 320a and second interface 320b by offsetting the interfaces 320a and 320b. The offset is in a substantially perpendicular direction with respect to the lateral spacing.

Direct thermal communication path 330 between two adjacent phase change memory elements 106 is defined as the shortest thermal connection between adjacent interfaces 320a-320b between phase change material 315 and electrodes 311. In one embodiment, direct thermal communication path 330 is through resistivity changing material 315 when it extends from electrode to electrode. In another embodiment, direct thermal communication path 330 crosses material boundaries.

The following FIGS. 4-12 illustrate embodiments for fabricating an array 102 of phase change memory elements 106 with reduced crosstalk as illustrated and described with reference to FIG. 3.

Figure 4:
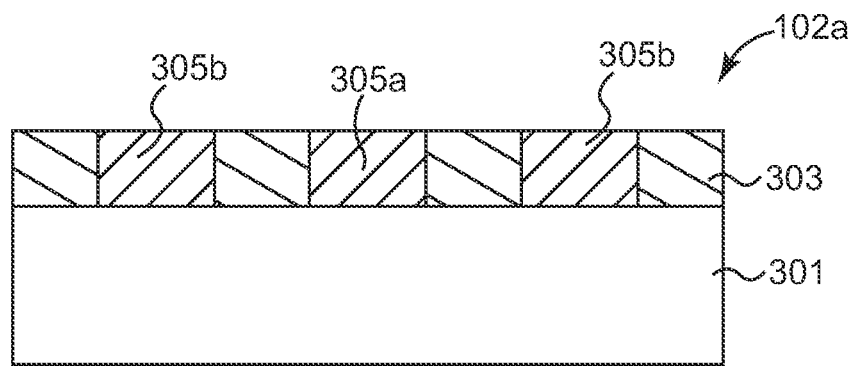
FIG. 4 illustrates a cross-sectional view of one embodiment of a substrate, contacts, and dielectric material.

FIG. 4 illustrates a cross-sectional view of one embodiment of substrate 301, contacts 305, and dielectric material 303. Substrate 301 may be pre-processed as previously described. Dielectric material 303 includes $SiO_2$, $SiO_x$, SiN, fluorinated silica glass (FSG), boro-phosphorous silicate glass (BPSG), boro-silicate glass (BSG), or other suitable dielectric material. Contacts 305 include TiN, TaN, W, Al, Ti, Ta, TiSiN, TaSiN, TiAlN, TaAlN, Cu, WN, C, or other suitable contact material. Contacts 305 are laterally surrounded by dielectric material 303 on substrate 301.

Figure 5:
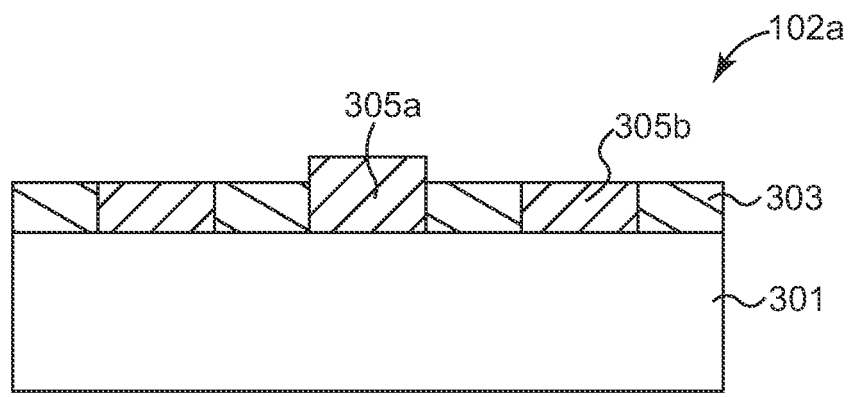
FIG. 5 illustrates a cross-sectional view of one embodiment of a substrate, contacts, and dielectric material after changing a height of one contact.

FIG. 5 illustrates a cross-sectional view of one embodiment of substrate 301, contacts 305a-305b, and dielectric material 303 after changing height of contact 305b with respect to contact 305a. The changing of height of contact 305b is performed by a suitable etch process. In one embodiment, contact 305b and dielectric material 303 is etched by masking contact 305a. In one embodiment, the etch process is a plasma induced dry etch process. In another embodiment, the etch process is a wet etch process. In one embodiment, instead of lowering contact 305b, the change of height is performed by the growth of contact 305a with respect to contact 305b using any suitable deposition technique.

Figure 6:
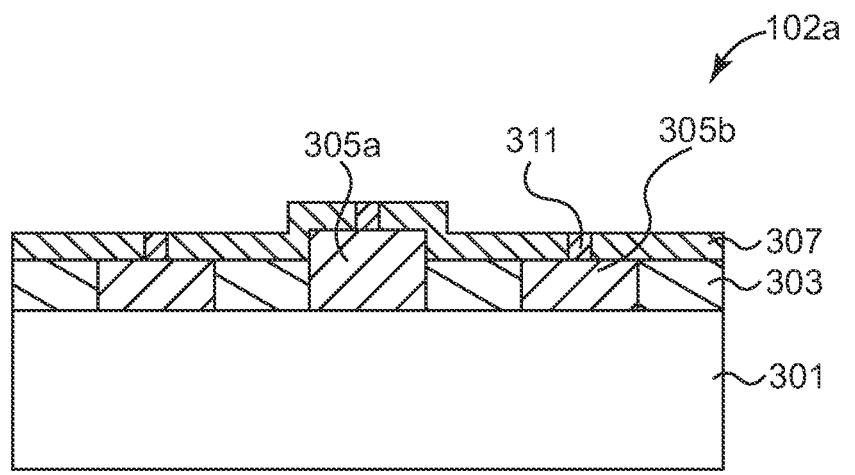
FIG. 6 illustrates a cross-sectional view of one embodiment of a substrate, contacts, and dielectric material after forming electrodes on top of the contacts.

FIG. 6 illustrates a cross-sectional view of one embodiment of substrate 301, contacts 305a-305b, and dielectric materials 303 and 307 after forming electrodes 311 on contacts 305a-305b. In one embodiment, dielectric material 307 is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique. Dielectric material 307 includes $SiO_2$, $SiO_x$, SiN, FSG, BPSG, BSG, or other suitable dielectric material. Within dielectric material 307 electrodes 311 are embedded. Electrodes 311 include TiN, TaN, W, Al, Ti, Ta, TiSiN, TaSiN, TiAlN, TaAlN, Cu, WN, C, or other suitable electrode material. Electrodes 311 are embedded by etching portions of the dielectric material 307 to expose contacts 305 and depositing electrode material. In another embodiment, electrodes 311 are formed by depositing electrode material using CVD, HDP-CVD, ALD, MOCVD, PVD, JVD, or other suitable deposition technique. Portions of the electrode material are removed to physically separate electrodes 311. Dielectric material 307 is deposited in between the electrodes 311 using CVD, HDP-CVD, ALD, MOCVD, PVD, JVD, or other suitable deposition technique. In one embodiment, planarization techniques as chemical mechanical planarization (CMP) are used for removing electrode material or dielectric material.

As illustrated in FIG. 3, after forming electrodes 311 on contacts 305 phase change material 315 is deposited using CVD, HDP-CVD, ALD, MOCVD, PVD, JVD, or other suitable deposition technique. Top electrode 317 is deposited over tise structure using CVD, HDP-CVD, ALD, MOCVD, PVD, JVD, or other suitable deposition technique. Top electrode 317 includes TiN, TaN, W, Al, Ti, Ta, TiSiN, TaSiN, TiAlN, TaAlN, Cu, WN, C, or other suitable contact material.

Figure 7:
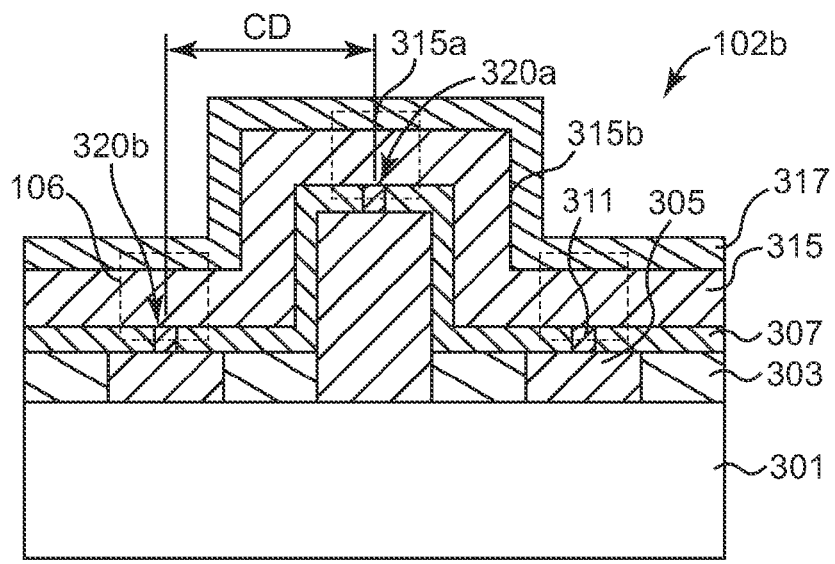
FIG. 7 illustrates a cross-sectional view of another embodiment of an array of resistivity changing memory elements wherein an offset is greater than a thickness of resistivity changing material.

FIG. 7 illustrates a cross-sectional view of another embodiment of an array 102b of phase change memory elements 106 wherein an offset is greater than a thickness of the phase change material 315. A first direction is defined by the lateral spacing of interfaces 320a-320b between phase change material 315 and electrodes 311. A second direction is defined substantially perpendicular to the first direction. Adjacent interfaces 320a-320b are offset with respect to the second direction. The offset is greater than the thickness of the phase change material 315. In one embodiment, phase change material at the side of the step 315b between adjacent phase change memory elements has another thickness than on top 315a of electrodes 311. In another embodiment, phase change material at the side of the step 315b between adjacent memory elements has a thinner thickness than on top 315a of electrodes 311. In one embodiment, this arrangement further reduces crosstalk. In another embodiment, the phase change material 315 vanishes at the sides of the step 315b between adjacent memory elements 106 resulting in physical separation of first interface 320a at the first electrode and second interface 320b at the second electrode.

Figure 8:
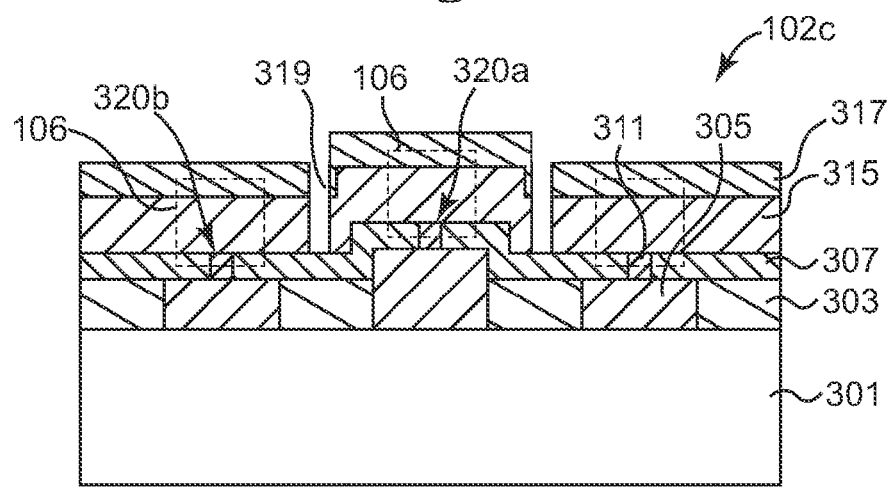
FIG. 8 illustrates a cross-sectional view of another embodiment of an array of resistivity changing memory elements wherein storage locations at electrodes are physically separated.

FIG. 8 illustrates a cross-sectional view of another embodiment of an array 102c of phase change memory elements 106 wherein first interface 320a at the first electrode and the second interface 320b at the second electrode are physically separated. A trench 319 is formed by removing phase change material 315 between adjacent phase change memory elements 106. In one embodiment, removing phase change material 315 between adjacent phase change memory elements 106 is performed by an etch process such as plasma induced dry etch process. In other embodiments, phase change material 315 is removed by wet etch or other suitable processes.

The direct thermal communication path between interfaces 320a-320b of adjacent phase change memory elements 106 crosses the material boundaries between resistivity changing material 315 and trench 319. In one embodiment, trench 319 is filled with dielectric material using CVD, HDP-CVD, ALD, MOCVD, PVD, JVD, or other suitable deposition technique.

Figure 9:
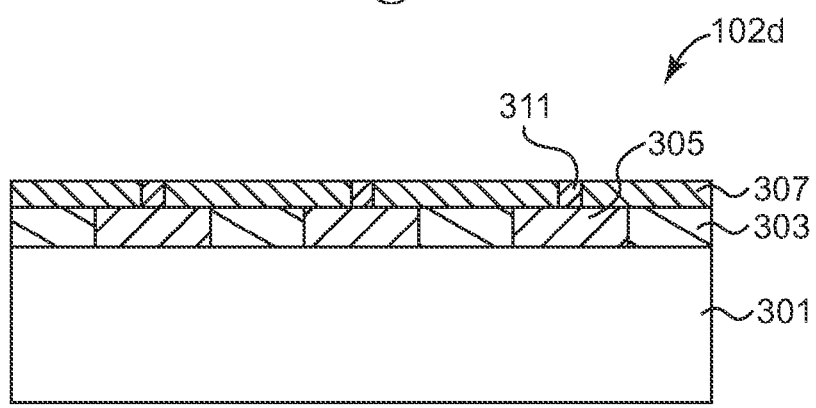
FIG. 9 illustrates a cross-sectional view of another embodiment of a substrate, electrodes, and dielectric material.

FIG. 9 illustrates a cross-sectional view of another embodiment of substrate 301, electrodes 311, contacts 305, and dielectric materials 303 and 307. Dielectric material 303 and 307 includes $SiO_2$, $SiO_x$, SiN, FSG, BPSG, BSG, or other suitable dielectric material. FIG. 9 corresponds to FIG. 6, besides electrodes 311 are having no offset.

Figure 10:
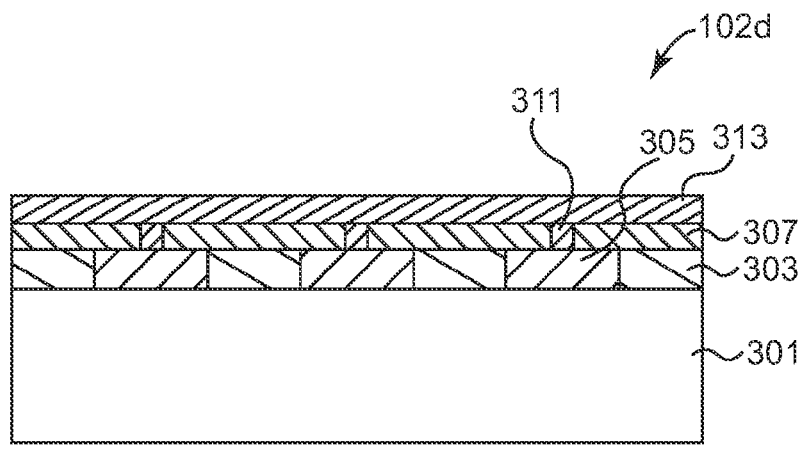
FIG. 10 illustrates a cross-sectional view of one embodiment of a substrate, electrodes, and dielectric material after depositing barrier material.

FIG. 10 illustrates a cross-sectional view of one embodiment of substrate 301, electrodes 311, contacts 305, and dielectric materials 303 and 307 after depositing a barrier material 313. Barrier material 313 is deposited using CVD, HDP-CVD, ALD, MOCVD, PVD, JVD, or other suitable deposition technique. A dielectric material, such as $SiO_2$, porous $SiO_2$, aerogel, xerogel, low-k dielectric, SiN, or other suitable dielectric material is used to form barrier material 313.

Figure 11:
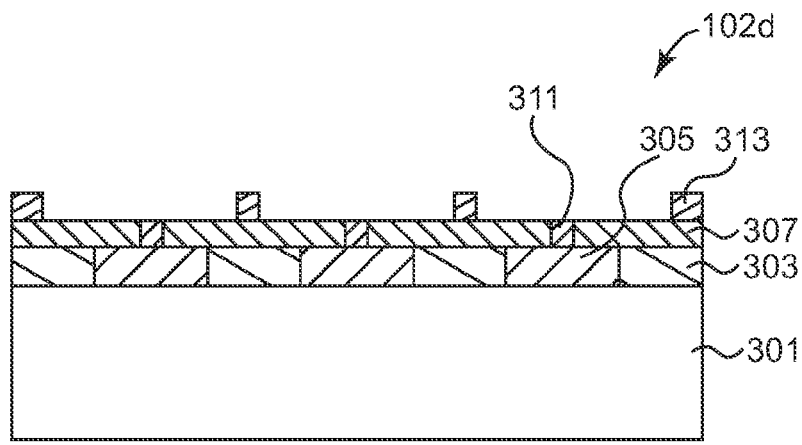
FIG. 11 illustrates a cross-sectional view of one embodiment of a substrate, electrodes, dielectric material, and barrier material after removing a portion of the barrier material.

FIG. 11 illustrates a cross-sectional view of one embodiment of substrate 301, electrodes 311, contacts 305, dielectric materials 303 and 307, and barrier material 313 after removing a portion of barrier material 313. In one embodiment, removing of barrier material 313 is performed by an etch process such as plasma induced dry etch process. In other embodiments, barrier material 313 is removed by wet etch or other suitable processes to remove a portion of barrier material 313. Portions of barrier material 313 are removed to expose electrodes 311.

Figure 12:
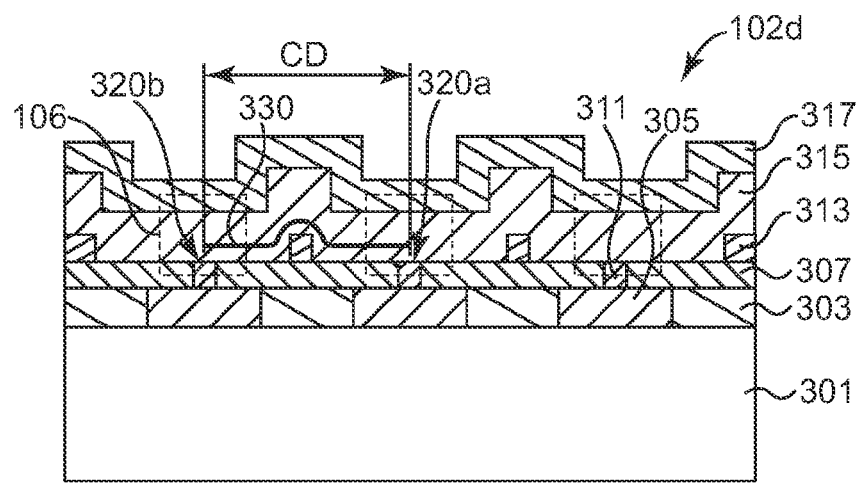
FIG. 12 illustrates a cross-sectional view of another embodiment of an array of resistivity changing memory elements.

FIG. 12 illustrates a cross-sectional view of one embodiment of an array 102d of phase change memory elements 106. Phase change material 315 is deposited over the structure illustrated in FIG. 11 by using CVD, HDP-CVD, ALD, MOCVD, PVD, JVD, or other suitable deposition technique. Direct thermal communication path 330 between interface 320a and interface 320b at electrodes 311 passes through phase change material 315 and around the remaining portions of barrier material 313. In one embodiment, barrier material 313 has a lower thermal conductivity than resistivity changing material 315. In other embodiments, barrier material 313 has an equal of higher thermal conductivity than resistivity changing material 315, for which direct thermal communication path 330 still passes around remaining portions of barrier material 313 due to the heat transfer at the boundaries between resistivity changing material 315 and barrier material 313.

While the specific embodiments described herein substantially focused on using phase change memory elements, the present invention can be applied to any suitable type of resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a first electrode;
a second electrode;
a first resistivity changing material contacting the first electrode at a first interface;
a second resistivity changing material contacting the second electrode at a second interface; and
a resistivity changing material extending between the first resistivity changing material and the second resistivity changing material;
wherein the first interface is spaced apart from the second interface by a lateral distance, and
wherein a direct communication path between the first interface and the second interface is greater than the lateral distance.

2. The integrated circuit of claim 1, wherein the direct communication path comprises at least one of a thermal communication path and an electrical communication path.

3. The integrated circuit of claim 1, wherein a first direction is defined by the lateral spacing of the first interface and the second interface,
wherein a second direction is defined substantially perpendicular to the first direction, and
wherein the first interface and the second interface are offset with respect to the second direction.

4. The integrated circuit of claim 3, wherein the offset is greater than a thickness of the resistivity changing material.

5. The integrated circuit of claim 3, wherein the resistivity changing material forms a plate of resistivity changing material.

6. The integrated circuit of claim 1, wherein:
the resistivity changing material extending between the first resistivity changing material and the second resistivity changing material contains
a barrier structure within the resistivity changing material.

7. The integrated circuit of claim 6, wherein the barrier material has a lower thermal conductivity than the resistivity changing material.

8. The integrated circuit of claim 6, wherein the barrier material comprises one of $SiO_2$, porous $SiO_2$, aerogel, xerogel, SiN, and a low-k dielectric.

9. The integrated circuit of claim 1, wherein the resistivity changing material comprises a phase change material.

10. A memory comprising:
a first electrode;
a second electrode; and
a resistivity changing material extending from a first interface at the first electrode to a second interface at the second electrode,
wherein the first interface is spaced apart from the second interface by a lateral distance, and
wherein a distance between the first interface and the second interface through the resistivity changing material is greater than the lateral distance.

11. The memory of claim 10, further comprising:
a barrier structure within the resistivity changing material.

12. The memory of claim 11, wherein a material of the barrier structure has a lower thermal conductivity than the resistivity changing material.

13. The memory of claim 11, wherein the material of the barrier structure comprises one of $SiO_2$, porous $SiO_2$, aerogel, xerogel, SiN, and a low-k dielectric.

14. The memory of claim 10, wherein a first direction is defined by the lateral spacing of the first interface and the second interface,
wherein a second direction is defined substantially perpendicular to the first direction,
wherein the first interface and the second interface are offset with respect to the second direction.

15. The integrated circuit of claim 14, wherein the offset is greater than a thickness of the resistivity changing material.

16. The memory of claim 10, wherein the resistivity changing material comprises a phase change material.

17. A system comprising:

a host; and a memory device communicatively coupled to the host, the memory device comprising:

a first electrode;

a second electrode; and a resistivity changing material extending from a first interface at the first electrode to a second interface at the second electrode, wherein the first interface is spaced apart from the second interface by a lateral distance, and wherein the distance between the first interface and the second interface through the resistivity changing material is greater than the lateral distance.

18. The system of claim 17, further comprising:

a barrier structure within the resistivity changing material.

19. The system of claim 17, wherein a first direction is defined by the lateral spacing of the first interface and the second interface, wherein a second direction is defined substantially perpendicular to the first direction, and wherein the first interface and the second interface are offset with respect to the second direction.

20. The system of claim 17, wherein the memory device further comprises:

a write circuit configured to program a storage location at the first interface and a storage location at the second interface;

a sense circuit configured to read the storage location at the first interface and the storage location at the second interface; and a controller configured to control the write circuit and the sense circuit.

21. A method for fabricating an integrated circuit, the method comprising:

providing a substrate including a first electrode, a second electrode, and isolation material between the first electrode and the second electrode;

depositing a barrier material over the first electrode, the second electrode, and the isolation material;

removing a portion of the barrier material to expose the first electrode and the second electrode; and depositing a resistivity changing material over the first electrode, the second electrode, and the barrier material.

22. The method of claim 21, further comprising:

depositing an etch stop material over the substrate; and removing a portion of the etch stop material to expose the first electrode and the second electrode.

* * * * *